United States Patent [19]

Marmet et al.

[11] 4,232,270
[45] Nov. 4, 1980

[54] HIGH GAIN DIFFERENTIAL AMPLIFIER WITH POSITIVE FEEDBACK

[75] Inventors: Melvin L. Marmet, Corona; Clarence W. Padgett, Westminster, both of Calif.

[73] Assignee: Rockwell International Corporation, Segundo, Calif.

[21] Appl. No.: 48,559

[22] Filed: Jun. 14, 1979

[51] Int. Cl.³ .......................... H03F 3/45; H03F 3/16
[52] U.S. Cl. .................................... 330/253; 330/260
[58] Field of Search ................................ 330/253, 260

[56] References Cited

U.S. PATENT DOCUMENTS 3,970,950  7/1976  Freeman et al. .................... 330/253
4,079,332  3/1978  Padget .................................. 330/253

Primary Examiner—Alfred E. Smith
Assistant Examiner—T. N. Grigsby
Attorney, Agent, or Firm—H. Fredrick Hamann; Richard A. Bachand; Daniel R. McGlynn

[57] ABSTRACT

An improved high gain, field effect transistor differential amplifier including first and second cascade connected inverter stages, a feedback controlled source of current connected to each of the stages, including a source of controlled positive feedback for increasing the voltage gain. A positive feedback path is connected between an output terminal of the differential amplifier and the source of current so that the current in each inverter stage is more precisely controlled.

8 Claims, 4 Drawing Figures

HIGH GAIN DIFFERENTIAL AMPLIFIER WITH POSITIVE FEEDBACK

BACKGROUND OF THE INVENTION

1. Field of the Invention

The invention relates to high gain, MOS field effect transistor differential amplifier.

2. Prior Art

Conventional differential amplifiers achieve relatively low voltage gain. Moreover, these amplifiers are typically implemented by the interconnection of non-complementary transistor devices. This has the undesirable effect of limiting the output voltage swing of the amplifier due to an inherent threshold level drop in voltage. What is more, many amplifier circuits are dynamic in operation, requiring bootstrap capacitor means and clocked precharge circuits. This is disadvantageous, inasmuch as the size and cost of the amplifier circuit are increased.

Examples of prior art circuits include the following:
U.S. Pat. No. 3,700,981 Oct. 24, 1972
U.S. Pat. No. 3,775,693 Nov. 27, 1973
U.S. Pat. No. 3,875,887 Apr. 8, 1975

Another improved field effect transistor differential amplifier, which operates from a 5.0 volt power supply, is shown in U.S. Pat. No. 4,079,332, issued Mar. 14, 1978. Although such circuits achieve good voltage gain, the demanding requirements of certain applications make such a circuit disadvantageous for use therein.

One of the important applications for such a differential amplifier is as a sense amplifier in a memory circuit. The development of high speed static memories which incorporate a plurality of field effect transistors in series result in voltage swings of less than 500 milivolts. Such prior art differential amplifiers as discussed above, could not distinguish voltage swings having a difference of less than 500 milivolts. The prior art differential amplifiers are therefore unsuitable for such applications.

SUMMARY OF THE INVENTION

Briefly, and in general terms, the present invention provides an improved high gain field effect transistor differential amplifier. More particularly, the differential amplifier is an MOSFET circuit in which a controlled amount of positive feedback is added for increasing the voltage gain, and is therefore able to detect voltage swings of less than 500 milivolts.

The high gain differential amplifier according to the present invention, includes a first inverter stage having a first series connected depletion and enhancement mode transistor devices, and an additional enhancement mode transistor device connected in parallel with the first enchancement mode device; a second inverter stage including second series connected depletion and enhancement mode transistor devices, and a second enhancement mode transistor device connected in parallel with said first enhancement mode transistor device in said second series; the first and the second inverter stages being cascaded together between first and second electrical junctions; a voltage source connected to each of the inverter stages at a first of the electrical junctions; each of the inverter stages having a respective input and output terminal; the output of the first inverter stage being connected to the control electrode of the second enhancement mode transistor device of the second inverter stage, the output of the second stage being connected to the control electrode of the enhancement mode transistor device of the first inverter stage; a current source including a further enhancement mode transistor device connected to each of the inverter stages at the second of the electrical junctions; and a positive feedback coupling connecting the control terminal of the further enhancement mode transistor device with the control terminal of the first inverter stage depletion mode transistor device and a point between the first series connected depletion and enhancement mode transistor devices of said first inverter stages for maximizing the gain of the differential amplifier.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawings.

A BRIEF DESCRIPTION OF THE DRAWING

DESCRIPTION OF THE PREFERRED EMBODIMENTS

Figure 1A:
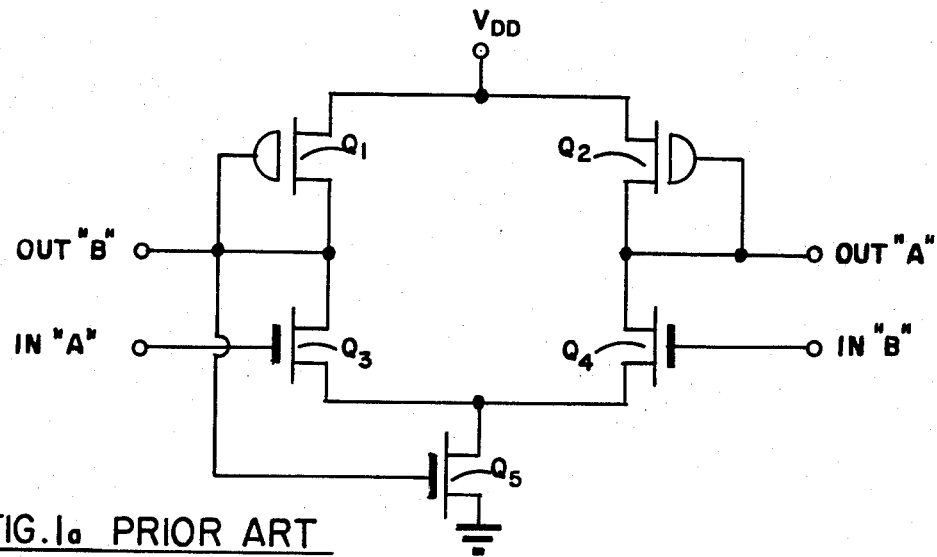
FIGS. 1a and 1b are schematic diagrams of prior art field effect transistor differential amplifiers known in the prior art.
Figure 1B:
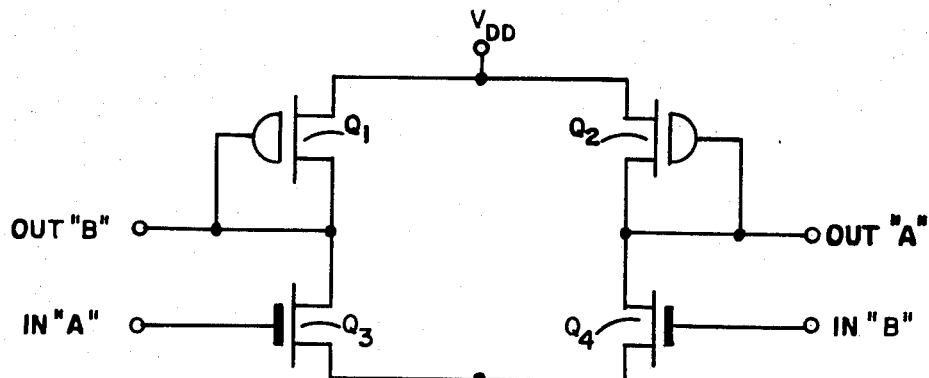

Referring now to the drawing, FIGS. 1a and 1b are schematic diagrams of a field effect transistor differential amplifier such as that known in the prior art and taught according to U.S. Pat. No. 4,079,332, issued Mar. 14, 1978. A detailed description of the function and operation of such circuits are described in detail in such patent, which is herein incorporated by reference.

Figure 2:
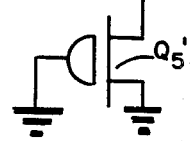
FIG. 2 is a schematic diagram of a preferred circuit for implementing an improved differential amplifier according to the present invention.

FIG. 2 is a schematic diagram of a preferred circuit for implementing the presently disclosed field effect transistor differential amplifier as taught by the present invention. It is noted that the basic difference between the present circuit and those in the prior art is the addition of two FETs $Q_6$ and $Q_7$ which function to add a controlled amount of positive feedback to the circuit for increasing the voltage gain.

In FIG. 2, the conduction path of a first depletion mode FET $Q_1$ is electrically connected in series with the conduction path of first and second enhancement mode FETs $Q_3$ and $Q_6$ which are connected in parallel. The control or gate electrodes of FET $Q_1$ and $Q_7$, and one conduction path electrode of FETs $Q_3$ and $Q_6$ respectively are connected together to form an output terminal B (labelled OUT "B"). The gate electrode of FET $Q_3$ forms an input terminal A (labelled IN "A"). The conduction path of a second depletion mode FET $Q_2$ is electrically connected in series with the conduction path of a third and fourth enhancement mode FETs $Q_4$ and $Q_7$. The control or gate electrodes of FETs $Q_2$ and $Q_6$ and one conduction path electrode of FETs $Q_4$ and $Q_7$ are respectively connected together to form an output terminal A labelled OUT "A"). The gate electrode of FET $Q_4$ forms an input terminal B. The series connected conduction paths of FETs $Q_1$ and devices $Q_3$ and $Q_6$ are electrically connected in parallel with a series connected conduction paths of FETs $Q_2$ and the parallel connection of $Q_4$ and $Q_7$, between a relatively positive source of reference voltage $V_{DD}$ (e.g. a 5 volt d.c. supply), and a common electrical junction 10. Thus, as will be recognized by those skilled in the art, FETs $Q_1$ and $Q_3$ comprise a first inverter stage 1 cascaded with a second inverter stage 5 comprised of FETs $Q_2$ and $Q_4$.

In the preferred embodiment, depletion FETs $Q_1$ and $Q_2$ function as matched load impedances. They are therefore fabricated with substantially identical channel lengths and widths, with the channel lengths relatively long and the channel widths relatively narrow. The enhancement FETs $Q_3$ and $Q_4$ are also typically matched in size and have typically short channel lengths and relatively wide channel widths for providing low resistances.

In further accordance with the present invention, the conduction path of an additional enhancement mode FET $Q_8$ is connected between the common electrical junction 10 and a source of relatively negative reference potential, such as ground. The channel width of FET $Q_8$ is typically about half of that of either FET $Q_3$ or $Q_4$. In operation FET $Q_8$ functions as a feedback controlled variable source of current. In the present embodiment the channel width of FET $Q_8$ is typically about half of that of either FET $Q_3$ or $Q_4$. The channel width of FET $Q_6$ is selected to provide optimum amplifier performance with respect to the voltage level of the signal applied to input terminal B.

Although $Q_8$ is shown as an enhancement FET, it may also be implemented as a depletion FET.

The channel widths of FETs $Q_6$ and $Q_7$ are small compared to the channel widths of $Q_3$ and $Q_4$, for the purpose of controlling the amount of positive feedback provided by $Q_6$ and $Q_7$.

Figure 3:
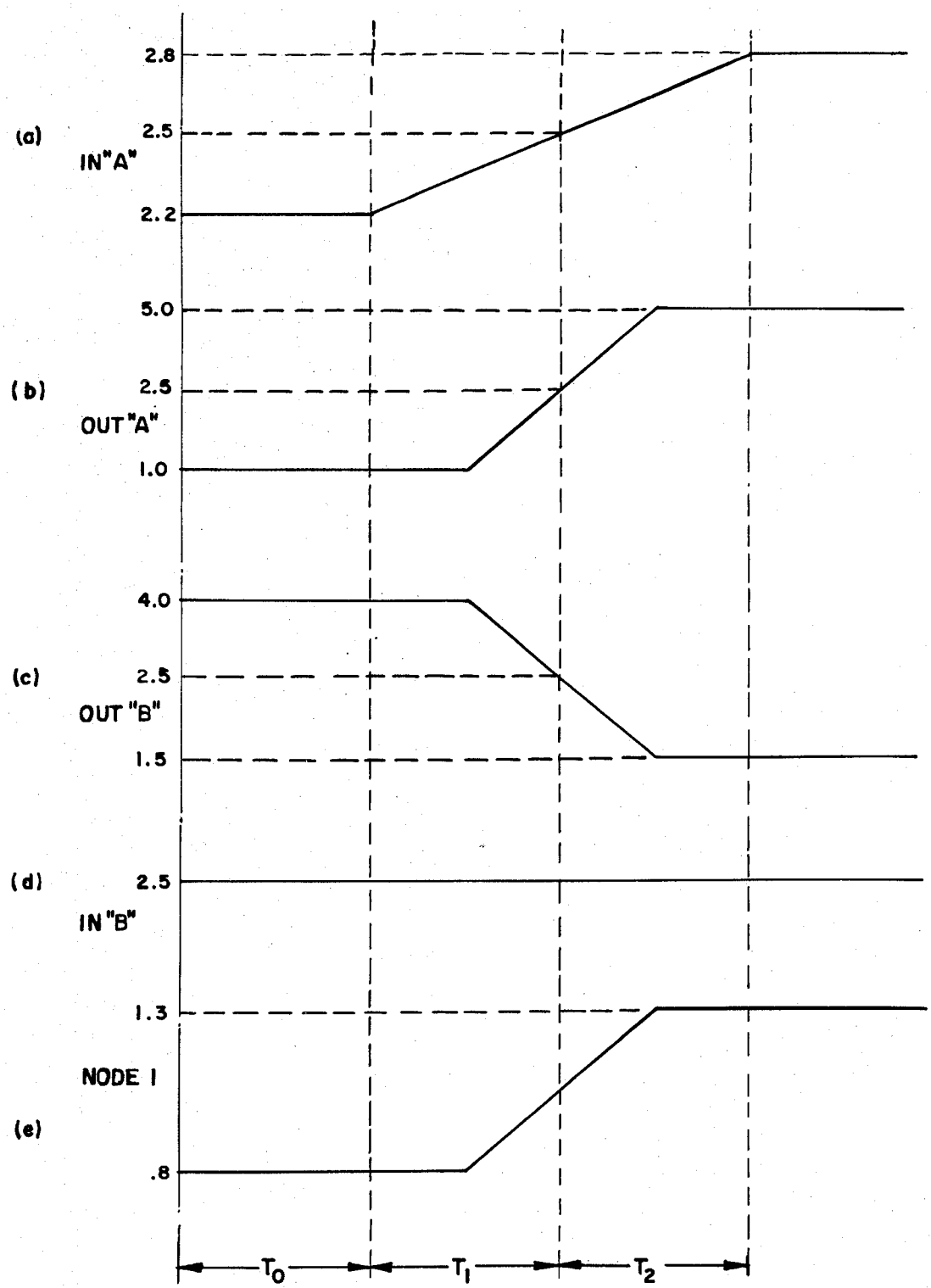
FIGS. 3a-3e are graphical representations of waveforms representative of signals at selective terminals of the differential amplifier circuit according to the present invention.

The operation of the improved high gain differential amplifier according to the present invention may be described by concurrently referring to FIGS. 2 and 3.

FIG. 3a is a graphical representation of the applied input signal at the IN "A" terminal of the circuit;

FIG. 3b is a graphical representation of the signal at the OUT "A" terminal of the circuit;

FIG. 3c is a graphical representation of the signal at the OUT "B" terminal of the circuit;

FIG. 3d is a graphical representation of the applied signal at the IN "B" terminal of the circuit;

FIG. 3e is a graphical representation of the signal at Node 1 in the circuit.

During an initial interval of time, designated $o$, differential input signals are applied to input terminal A and B as shown in FIGS. 3a and 3d. Terminal A receives +2.2 volts and terminal B receives +2.5 volts. The differential input signals produce a current imbalance since FET $Q_4$ is driven harder than FET $Q_3$. FET $Q_3$ is rendered nearly non-conductive, and output terminal B is driven close to $V_{DD}$ via the conduction path of $Q_1$. The relatively large positive signal at output terminal B is applied to the gate electrode of FET $Q_8$ via positive feedback path 2. FET $Q_7$ is thus turned on hard, which drives junction 10 to a voltage (+0.8) close to ground via the conduction path of $Q_8$. Output terminal A is thereby driven to apprixmately +1.0 volts via the relatively low impedance conduction paths of FETs $Q_4$, $Q_7$, and $Q_8$, as shown in FIG. 3b.

The relatively large positive signal at output terminal B, as shown in FIG. 3d, is also applied to the gate electrode of FET $Q_7$ via the second positive feedback path 4. Hence, $Q_7$ is turned on hard and provides a conduction path which aids the aforementioned conduction path of $Q_4$ in driving output terminal A to approximately 1.0 volts. The conduction path of $Q_7$ is designed to have approximately 15% to 20% of the current that flows in FED $Q_4$. This limits the positive feedback provided by FET $Q_7$ to prevent oscillations or latching such as occurs in a set-reset flip-flop. The conduction path of FET $Q_7$ is controlled by making the channel width a small fraction of the width of the channel of FET $Q_4$.

The relatively low positive voltage at output terminal A is applied to the gate electrode of FET $Q_6$ via a third positive feedback path 3. FET $Q_6$ is rendered non-conductive by the 1.0 volt level of output terminal A, which allows the conduction path of FET $Q_1$ to drive output terminal B to a relatively large positive voltage.

During time interval $t_1$, input A increases from +2.2 volts to +2.5 volts. As input A increases toward +2.5 volts, FET $Q_3$ is turned on harder and more current is conducted therethrough. Output terminal B is driven toward +2.5 volts (from the +4.0 volts during $t_o$) via the conduction paths of FETs $Q_3$ and $Q_8$. The decreasing voltage on output terminal B is applied to FET $Q_8$ via feedback path 2, which reduces the conductivity of $Q_8$. As a result, the voltage of junction 1 is increased as shown in FIG. 3e. This acts to reduce the current in $Q_4$. Output terminal A is thus driven more positive via the conduction path of FET $Q_2$. The decreasing voltage on output terminal B is fed to the gate electrode of $Q_7$, which decreases the conduction of $Q_7$ thus allowing the conduction path of $Q_2$ to drive output terminal A more positively. The increasing voltage on output terminal A is fed to the gate electrode of $Q_6$ via path 3. The increased conductivity of $Q_6$ aids $Q_3$ in driving output terminal B toward +2.5 volts during $t_1$, thus adding positive feedback.

At the end of $t_1$, input A and input B are both at +2.5 volts. With matching channel dimensions in the FETs as described above, the symmetry of the circuit will result in output terminals A and B having the same voltage level, typically 2.5 volts with $V_{DD} = 5.0$ volts.

The events during time interval $t_2$ are a continuation of the events during $t_1$. By the end of $t_2$, input A is +2.8 volts, output A is +5.0 volts, and output B is approximately +1.5 volts as shown in FIGS. 3a,b, and c. Common junction 1 has increased to approximately +1.3 volts which causes $Q_7$ and $Q_4$ to be non-conductive. FET $Q_6$ is turned on hard since output terminal A is +5.0 volts. The current conducted by $Q_6$ aids the current conducted by $Q_3$ in driving the common junctions 1 positively, which is positive feedback, as shown by FIG. 3e.

The addition of FETs $Q_6$ and $Q_7$, shown in FIG. 2, add a controlled amount of positive feedback to the circuit which increases the voltage gain. One other important improvement is a lower output voltage at output terminal A when input terminal A is less than or equal to −2.2 volts, as shown in FIGS. 3a and 3b, time interval $t_o$. The lower output voltage is the result of the conduction of FET $Q_6$ aiding the conduction of FET $Q_4$. Output terminal A is driven relatively negative by the conduction of FETs $Q_4$, $Q_7$, and $Q_8$. The addition of FET $Q_7$ therefore provides a lower output voltage at output terminal A when input terminal A is less than or equal to +2.2 volts. In other words, the addition of FETs $Q_6$ and $Q_7$ improve the large signal gain of the circuit in addition to the small signal voltage gain.

It will be apparent that while a preferred embodiment of the invention has been shown and described, various modifications and changes may be made without departing from the true spirit and scope of the invention. For example the presently disclosed improved high gain differential amplifier may form a sense amplifier to be connected to an array of information storage cells for providing suitable indication concerning the condition of the information contained therein. It is also to be understood that the voltage levels illustrated in FIGS. 3a—e are for exemplary purposes only. The signals applied to input terminals A and B, as well as that supplied from the $V_{DD}$ voltage source may be conveniently selected, as desired, for a particular application.

Having set forth a preferred embodiment of the instant invention, what is claimed is:

1. In combination: first, second, third, fourth, fifth and sixth multiterminal semiconductor devices having respective conduction path terminals and a control terminal,
   the conduction paths of the first and second of said multiterminal devices connected in a first series circuit;
   the conduction paths of the first and the fifth of said multiterminal devices connected in a second series circuit;
   the conduction paths of the third and fourth of said multiterminal devices connected in a third series circuit;
   the conduction paths of the third and the sixth of said multiterminal devices connected in a fourth series circuit, said first and third series circuits connected together to form a first electrical junction with a source of relatively positive reference potential;
   the first output terminal connected to both the control terminal of said first device, to the first series circuit formed by the conduction paths of said first and second devices, and to the control terminal of said sixth device;
   a second output terminal connected to both the control terminal of said third device, the third series circuit formed by the conduction paths of said third and fourth devices, and to the control terminal of said fifth device;
   first and second input terminals respectively connected to the control terminals of said second and said fourth devices;
   said fifth multiterminal semiconductor device having a conduction path in parallel with said second semiconductor device,
   said sixth multiterminal semiconductor device having a conductor path in parallel with said fourth semiconductor device,
   a seventh multiterminal semiconductor device having conduction path terminals and a control terminal;
   said seventh multiterminal semiconductor device connected between a source of relatively negative reference potential and a second electrical junction formed by the connection together of said first, second, third, and fourth series circuits, and
   positive feedback means connected between said first output terminal and the control terminal of said seventh multiterminal device to control the conductivity of said seventh device.

2. The combination as recited in claim 1, wherein each of said first, second, third, fourth, fifth, and sixth multiterminal semiconductor devices is a field effect transistor.

3. The combination as recited in claim 2, wherein said first and third field effect transistors are depletion mode transistor devices, and said second, fourth, fifth, and sixth field effect transistors are enhancement mode devices.

4. The combination as recited in claim 1, wherein said seventh multiterminal semiconductor device is a field effect transistor.

5. The combination as recited in claim 4, wherein said field effect transistor is an enhaneement mode device.

6. The combination as recited in claim 4, wherein said field effect transistor operates as a current source.

7. The combination as recited in claim 1, wherein said first and second multiterminal devices form a first inverter stage, said third and fourth multiterminal devices form a second inverter stage, and said first and second inverter stages are cascaded together.

8. A high gain differential amplifier comprising:
   a first inverter stage including first series connected depletion and enhancement mode transistor devices, and additional enhancement mode transistor device connected in parallel with said first enhancement mode device;
   a second inverter stage including second series connected depletion and enhancement mode transistor devices, and a second enhancement mode transistor device connected in parallel with said first enhancement mode transistor device;
   said first and second inverter stages cascaded together between first and second electrical junctions;
   voltage source means connected to each of said inverter stages at a first of said electrical junctions;
   each of said inverter stages having respective input and output terminal means;
   the output means of said first inverter stage being connected to the control electrode of said second enhancement mode transistor device in said second inverter stage, and said output means of said second inverter stage being connected to the control electrode of said enhancement mode transistor device of said first inverter stage;
   current source means comprising an additional enhancement mode transistor device connected to each of said inverter stages at the second of said electrical junctions; and
   positive feedback means connecting the control terminal of said additional enhancement mode transistor device with the control terminal of said first inverter stage depletion mode transistor device and a point between the first series connected depletion and enhancement mode transistor devices of said first inverter stage for maximizing the gain of said differential amplifier.

* * * * *